(12) United States Patent
Bayle

(10) Patent No.: US 9,424,934 B2
(45) Date of Patent: Aug. 23, 2016

(54) NON-VOLATILE SEMICONDUCTOR MEMORY DEVICE AND WRITING METHOD THEREOF

(71) Applicant: POWERCHIP TECHNOLOGY CORPORATION, Hsin-Chu (TW)

(72) Inventor: Mathias Yves Gilbert Bayle, Tokyo (JP)

(73) Assignee: POWERCHIP TECHNOLOGY CORPORATION, Hsin-Chu (TW)

(*) Notice: Subject to any disclaimer, the term of this patent is extended or adjusted under 35 U.S.C. 154(b) by 0 days.

(21) Appl. No.: 14/625,436

(22) Filed: Feb. 18, 2015

(65) Prior Publication Data
US 2015/0325299 A1   Nov. 12, 2015

(30) Foreign Application Priority Data
May 9, 2014   (JP) .................. 2014-098029

(51) Int. Cl.
| G11C 16/10 | (2006.01) |
| G11C 16/34 | (2006.01) |
| G11C 14/00 | (2006.01) |
| G11C 8/08 | (2006.01) |
| G11C 8/10 | (2006.01) |
| G11C 8/14 | (2006.01) |

(Continued)

(52) U.S. Cl.
CPC ........ *G11C 16/10* (2013.01); *G11C 8/08* (2013.01); *G11C 8/10* (2013.01); *G11C 8/14* (2013.01); *G11C 14/0063* (2013.01); *G11C 16/0483* (2013.01); *G11C 16/08* (2013.01); *G11C 16/3427* (2013.01)

(58) Field of Classification Search
CPC .. G11C 16/10; G11C 14/0063; G11C 16/3427
See application file for complete search history.

(56) References Cited

U.S. PATENT DOCUMENTS 7,502,263 B2 * 3/2009 Park .................. G11C 8/08
365/185.17

(Continued)

FOREIGN PATENT DOCUMENTS

| JP | 09-147582 A | 6/1997 |
| JP | 2000-285692 A | 10/2000 |

(Continued)

*Primary Examiner* — Huan Hoang
*Assistant Examiner* — Tri Hoang
(74) *Attorney, Agent, or Firm* — Birch, Stewart, Kolasch & Birch, LLP

(57) ABSTRACT

A non-volatile semiconductor memory device utilized to implement the writing of data by adding a predetermined voltage for assigning a word line to a non-volatile memory cell includes a control process or generating and outputting control data implementing a program code for writing data including a word line assignment command and voltage source assignment data, a writing controller decoding the control data and generating a control signal of the word line assignment command and a control signal of the voltage source assignment data, a voltage generation circuit generating several voltages for writing data, and a switch circuit selecting a voltage, corresponding to voltage source assignment data, among several voltages, according to the control signal of the word line assignment command and the control signal of voltage source assignment data and outputting the selected voltage to the word line corresponding to the word line assignment command.

20 Claims, 19 Drawing Sheets

(51) Int. Cl.
*G11C 16/04* (2006.01)
*G11C 16/08* (2006.01)

(56) References Cited

U.S. PATENT DOCUMENTS

| | | | |
|---|---|---|---|
| 2011/0167206 A1 | 7/2011 | Bovino et al. | |
| 2012/0106250 A1 | 5/2012 | Surico et al. | |
| 2013/0013854 A1* | 1/2013 | Mun | G11C 16/0483 711/103 |
| 2015/0154118 A1* | 6/2015 | Marcu | G06F 12/1009 711/206 |

FOREIGN PATENT DOCUMENTS

| | | |
|---|---|---|
| JP | 2001-028575 A | 1/2001 |
| JP | 2001-325796 A | 11/2001 |
| JP | 2003-346485 A | 12/2003 |
| JP | 2011-150746 A | 8/2011 |

* cited by examiner (a) Program Code (1) WLSET_WLN_VWW (2) WLSET_NMINUSONE_VPASSWADJ (3) WLSET_SOURCESIDE0_VPASSWS Compile (b) Code Within ROM 21

(1) 7E_00_3

(2) 7E_01_6

(3) 7E_09_8

7bits  5bits  4bits
  M2BCODE[8:0]

| Voltage Source Assignment Data Code Within ROM 21 | Voltage Source Assignment Data (Name) Within Program Code |
|---|---|
| 0 | GND |
| 1 | EXVDD |
| 2 | VCPCK |
| 3 | VWW |
| 4 | VREAD |
| 5 | VPASSR |
| 6 | VPASSWADJ |
| 7 | VPASSWD |
| 8 | VPASSWS |
| 9 | VPASSWDT |
| A | VPASSWSB |
| --- | --- |
| F | FLOATING |

Word Line Assignment Command And Code

| Command | Code | Meaning |
|---|---|---|
| DRAINSIDE 1 | C | Select All WL select +2~ (higher CUT) |
| DRAINSIDE 0 | D | Select All WL select +2~ |
| NPLUSTWO | E | Select WL select +2 |
| NPLUSONE | F | Select WL select +1 |
| WLN | 0 | Select WL select |
| NMINUSONE | 1 | Select WL select -1 |
| NMINUSTWO | 2 | Select WL select -2 |
| NMINUSTHREE | 3 | Select WL select -3 |
| NMINUSFOUR | 4 | Select WL select -4 |
| NMINUSFIVE | 5 | Select WL select -5 |
| NMINUSSIX | 6 | Select WL select -6 |
| NMINUSSEVEN | 7 | Select WL select -7 |
| NMINUSEIGHT | 8 | Select WL select -8 |
| SOURCESIDE 0 | 9 | Select All WL select -9~ |
| SOURCESIDE 1 | A | Select All WL select -9~ (lower CUT) |
| SOURCE EDGE | B | Select WL 3~0 |
| DUMMY DRAIN | 10 | Select Drain side Dummy WL |
| DUMMY SOURCE | 11 | Select Source side Dummy WL |
| ALLWL | 12 | Select All WL |
| ALLWLMN | 13 | Select All WL except WL select |
| ALLWLPRECH | 14 | Select All WL that use High Voltage during PGM |
| WLZERO | 15 | Select WL 0 |
| WLONE | 16 | Select WL 1 |
| WL63 | 17 | Select WL 63 |
| WL62 | 18 | Select WL 62 |

FIG. 9

An Example of Command of Program
    WL_selected=WL32
(T1) WLSET_WLN_VWW
(T2) WLSET_NMINUSONE_VPASSWADJ
    NOP
    NOP
(T3) WLSET_SOURCE0_VPASSWS

| Select WL | 32 |
|---|---|
| DWL Drain | DUMMY_DRAIN |
| 63 | WL63 |
| 62 | WL62 |
| 61 | DRAINSIDE_0 |
| 60 | DRAINSIDE_0 |
|  | ... |
| 46/54 | ... |
| 45/53 | ... |
| 44/52 | ... |
| 43/51 | ... |
| 42/50 | ... |
|  | ... |
|  | ... |
|  | ... |
| 36 | DRAINSIDE_0 |
| 35 | DRAINSIDE_0 |
| 34 | N+2 |
| 33 | N+1 |
| 32 | N |
| 31 | N-1 |
| 30 | N-2 |
| 29 | N-3 |
| 28 | N-4 |
| 27 | N-5 |
| 26 | N-6 |
| 25 | N-7 |
| 24 | N-8 |
| 23 | SOURCESIDE_0 |
| 22 | SOURCESIDE_0 |
|  | ... |
|  | ... |
|  | ... |
| 16/8 | ... |
| 15/7 | ... |
| 14/6 | ... |
| 13/5 | ... |
| 12/4 | ... |
|  | ... |
|  | ... |
| 3 | SOURCESIDE_0 |
| 2 | SOURCESIDE_0 |
| 1 | SOURCE_EDGE |
| 0 | WLZERO |
| DWL Source | DUMMY_SOURCE |

FIG. 17

Example of Allocating Program Voltages

| Select WL | Mode 0 | | Mode 1 | | Mode 2 | |
|---|---|---|---|---|---|---|
| | 32 | | 32 | | 32 | |
| DWL Drain | DUMMY_DRAIN | VPASSWDD | DUMMY_DRAIN | VPASSWDD | DUMMY_DRAIN | VPASSWDD |
| 63 | DRAINSIDE_0 | VPASSWD | DRAINSIDE_0 | VPASSWD | DRAINSIDE_0 | VPASSWD |
| 62 | DRAINSIDE_0 | VPASSWD | DRAINSIDE_0 | VPASSWD | DRAINSIDE_0 | VPASSWD |
| 61 | ... | ... | ... | ... | ... | ... |
| 60 | ... | ... | ... | ... | ... | ... |
| | ... | ... | ... | ... | ... | ... |
| 46/54 | | | | | | |
| 45/53 | ... | ... | ... | ... | ... | ... |
| 44/52 | ... | ... | ... | ... | ... | ... |
| 43/51 | ... | ... | ... | ... | ... | ... |
| 42/50 | ... | ... | ... | ... | ... | ... |
| | ... | ... | ... | ... | ... | ... |
| | ... | ... | ... | ... | ... | ... |
| | ... | ... | ... | ... | ... | ... |
| 36 | | | | | | |
| 35 | DRAINSIDE_0 | VPASSWD | DRAINSIDE_0 | VPASSWD | DRAINSIDE_0 | VPASSWD |
| 34 | DRAINSIDE_0 | VPASSWD | DRAINSIDE_0 | VPASSWD | DRAINSIDE_0 | VPASSWD |
| 33 | N+1 | VPASSWADJ | N+1 | VPASSWADJ | N+1 | VPASSWADJ |
| 32 | N | VWW | N | VWW | N | VWW |
| 31 | N-1 | VPASSWADJ | N-1 | VPASSWADJ | N-1 | VPASSWADJ |
| 30 | N-2 | VPASSR | N-2 | VPASSR | N-2 | VPASSWD |
| 29 | N-3 | VREAD | N-3 | VREAD | N-3 | VPASSR |
| 28 | N-4 | VPASSR | N-4 | VREAD | N-4 | VPASSR |
| 27 | N-5 | VPASSWS | N-5 | VREAD | N-5 | VREAD |
| 26 | N-6 | VPASSWS | N-6 | VPASSR | N-6 | VREAD |
| 25 | N-7 | VPASSWS | N-7 | VPASSWS | N-7 | VPASSR |
| 24 | N-8 | VPASSWS | N-8 | VPASSWS | N-8 | VPASSR |
| 23 | SOURCESIDE_0 | VPASSWS | SOURCESIDE_0 | | SOURCESIDE_0 | VPASSWS |
| 22 | SOURCESIDE_0 | VPASSWS | SOURCESIDE_0 | ... | SOURCESIDE_0 | VPASSWS |
| | ... | ... | ... | ... | ... | ... |
| | ... | ... | ... | ... | ... | ... |
| | ... | ... | ... | ... | ... | ... |
| 16/8 | | | | | | |
| 15/7 | ... | ... | ... | ... | ... | ... |
| 14/6 | ... | ... | ... | ... | ... | ... |
| 13/5 | ... | ... | ... | ... | ... | ... |
| 12/4 | ... | ... | ... | ... | ... | ... |
| | ... | ... | ... | ... | ... | ... |
| | ... | ... | ... | ... | ... | ... |
| 3 | | | | | | |
| 2 | SOURCESIDE_0 | VPASSWS | SOURCESIDE_0 | VPASSWS | SOURCESIDE_0 | VPASSWS |
| 1 | SOURCESIDE_0 | VPASSWS | SOURCESIDE_0 | VPASSWS | SOURCESIDE_0 | VPASSWS |
| 0 | SOURCE_EDGE | VPASSR | SOURCE_EDGE | VPASSR | SOURCE_EDGE | VPASSR |
| DWL Source | DUMMY_SOURCE | VPASSWDS | DUMMY_SOURCE | VPASSWDS | DUMMY_SOURCE | VPASSWDS |

FIG. 18

Example of Allocating Program Voltages

| Select WL | 60 | 59 | 58 | 57 |
|---|---|---|---|---|
| DWL Drain | DUMMY_DRAIN | DUMMY_DRAIN | DUMMY_DRAIN | DUMMY_DR |
| 63 | DRAINSIDE_0 | DRAINSIDE_0 | DRAINSIDE_0 | DRAINSI |
| 62 | N+2 | DRAINSIDE_0 | DRAINSIDE_0 | DRAINSI |
| 61 | N+1 | N+2 | DRAINSIDE_0 | DRAINSI |
| 60 | N | N+1 | N+2 | DRAINSID |
| 59 | N-1 | N | N+1 | N+2 |
| 58 | N-2 | N-1 | N | N+1 |
| 57 | N-3 | N-2 | N-1 | N |
| 56 | N-4 | N-3 | N-2 | N-1 |
| 55 | N-5 | N-4 | N-3 | N-2 |
| 54 | N-6 | N-5 | N-4 | N-3 |
| 53 | N-7 | N-6 | N-5 | N-4 |
| 52 | N-8 | N-7 | N-6 | N-5 |
| 51 | SOURCESIDE_0 | N-8 | N-7 | N-6 |
| 50 | SOURCESIDE_0 | SOURCESIDE_0 | N-8 | N-7 |
| 49 | SOURCESIDE_0 | SOURCESIDE_0 | SOURCESIDE_0 | N-8 |
| 48 | SOURCESIDE_0 | SOURCESIDE_0 | SOURCESIDE_0 | SOURCES |

FIG. 19

All Possible Settings of Reading/Erasing

| Select WL | 32 |
| --- | --- |
| DWL Drain | DUMMY_DRAIN |
| 63 | WL63 |
| 62 | WL62 |
| 61 | DRAINSIDE_0 |
| 60 | DRAINSIDE_0 |
| | ... |
| | ... |
| | ... |
| | ... |
| | ... |
| | ... |
| | ... |
| | ... |
| | DRAINSIDE_0 |
| | DRAINSIDE_0 |
| 34 | N+2 |
| 33 | N+1 |
| 32 | N |
| 31 | N-1 |
| 30 | N-2 |
| 29 | N-3 |
| 28 | N-4 |
| 27 | N-5 |
| 26 | N-6 |
| 25 | N-7 |
| 24 | N-8 |
| | SOURCESIDE_0 |
| | SOURCESIDE_0 |
| | ... |
| | ... |
| | ... |
| | ... |
| | ... |
| | ... |
| | ... |
| | ... |
| 3 | SOURCESIDE_0 |
| 2 | SOURCESIDE_0 |
| 1 | SOURCE_EDGE |
| 0 | WLZERO |
| DWL Source | DUMMY_SOURCE |

FIG. 20

Setting Example for Reading

| | Read+(READ_VPASSRADJ) | |
|---|---|---|
| Select WL | 32 | |
| DWL Drain | ALLWLMN | VPASSR |
| 63 | ALLWLMN | VPASSR |
| 62 | ALLWLMN | VPASSR |
| 61 | ALLWLMN | VPASSR |
| 60 | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| 34 | ALLWLMN | VPASSR |
| 33 | N+1 | VPASSWADJ |
| 32 | N | VREAD |
| 31 | N-1 | VPASSWADJ |
| 30 | ALLWLMN | VPASSR |
| 29 | ALLWLMN | VPASSR |
| 28 | ALLWLMN | VPASSR |
| 27 | ALLWLMN | VPASSR |
| 26 | ALLWLMN | VPASSR |
| 25 | ALLWLMN | VPASSR |
| 24 | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| | ALLWLMN | VPASSR |
| 3 | ALLWLMN | VPASSR |
| 2 | ALLWLMN | VPASSR |
| 1 | ALLWLMN | VPASSR |
| 0 | ALLWLMN | VPASSR |
| DWL Source | ALLWLMN | VPASSR |

FIG. 21

NON-VOLATILE SEMICONDUCTOR MEMORY DEVICE AND WRITING METHOD THEREOF

CROSS REFERENCE TO RELATED APPLICATIONS

This application claims priority of Japanese Patent Application No. 2014-098029, filed on May 9, 2014, the entirety of which is incorporated by reference herein.

BACKGROUND OF THE INVENTION

1. Field of the Invention

The present invention relates to, for example, a non-volatile semiconductor memory device (EEPROM) capable of electrical writing and erasing such as a flash memory and so on and a writing method thereof.

2. Description of the Related Art

The high-density integrated NAND-type non-volatile semiconductor memory device is well-known and composed of NAND strings with serial connections of a plurality of memory cell transistors (called memory cell in the following) between the bit line and the source line (for example, referring to reference documents 1~4).

In the general NAND-type non-volatile semiconductor memory device, regarding the erasing, a high voltage of 20V, for example, is added to the semiconductor substrate, and 0V is added to the word line. Accordingly, the electrons are ejected from the floating gate, a charge accumulation layer made of for example, poly-silicon and so on, and the threshold voltage is lower than the erasing threshold voltage (for example, −3V). On the other hand, regarding the writing (programming), 0V is added to the semiconductor substrate, and the high voltage of 20V, for example, is added to the control gate. Therefore, by injecting the electrons from the semiconductor substrate to the floating gate, the threshold voltage is greater than the writing threshold voltage (for example, 1V). The memory cell receives such threshold voltages, and the status may be determined by adding the reading voltage (for example, 0V), between the writing threshold voltage and the erasing threshold voltage, to the control gate, and determined by whether there is current flowing on the memory cell or not. Therefore, writing is implemented to the selected memory cell among the memory cells which are connected in series within the NAND string, and the pass voltage (for example, 8V) is added to such word lines for the un-selected memory cells.

In the non-volatile semiconductor memory device composed as above, writing is executed by the programming operation on the memory cell which is the writing object, and the threshold voltage increases since the electrons are injected to the floating gate of the memory cell transistor. Accordingly, the current does not flow even though the voltages, which are lower than the threshold voltage, are added to the gate; therefore, the status of writing the data "0" is reached. Generally, the writing characteristics and the threshold voltage of the memory cell of the erasing status are uneven. Accordingly, the predetermined writing voltage is added to implement the program operation, and the threshold voltage is greater than the verify level for verification, and the distribution range of the threshold voltages of the memory cell after writing has a certain width.

In the case of anon-volatile semiconductor memory device of a multi-level memory cell with multi-levels for setting different threshold voltages on the memory cell, the threshold voltages are widely distributed, and it becomes difficult to implement the actual data record in the narrow gap between the adjacent level values. To solve the problem, in the Reference Document 5, the non-volatile memory core circuit for recording multi-levels is included by setting a plurality of different threshold voltages for the memory cell, and the control circuit to control the writing toward the memory core circuit is included. The control circuit is featured by that when programming the memory cell with one threshold voltage, the memory cell which is set with the above threshold voltage and the memory cell which is set with the threshold voltage greater than the above threshold voltage are both programmed with the above threshold voltage, and it is programmed (written) in sequence from the smaller threshold voltage than the above different threshold voltages.

However, when the non-volatile semiconductor memory device is programmed, the phenomenon of program disturbance happens. Specifically, there are bad modes of increasing the threshold voltage by the program operation. The programming for the same word line (the control gate) is frequently repeated, and the threshold voltage increases due to the high programming voltage in the non-writing memory cell and the non-selected memory cell in common with the word line. In addition, the threshold voltage increases due to the pass voltage of the un-selected word line of the selected NAND string in writing. Furthermore, in the NAND string which has shrunk by scaling in the recent years, the phenomenon of increasing the threshold voltage by the hot carriers caused by the boosted channel voltage due to the pass voltage added to the un-selected word line and the program voltage added to the above selected word line is also detected.

THE PRIOR ARTS

[Reference Document 1] JP H9-147582
[Reference Document 2] JP2000-285692
[Reference Document 3] JP2003-346485
[Reference Document 4] JP2001-028575
[Reference Document 5] JP2001-325796
[Reference Document 6] US2011-0167206
[Reference Document 7] US2012-0106250
[Reference Document 8] JP2011-150746

BRIEF SUMMARY OF THE INVENTION

The Problems Solved by the Present Invention

In order to prevent the above program disturbance, when programming, for example, for the un-selected word line of the NAND-type flash memory, the predetermined pass voltage is added which corresponds to the position from the un-selected word line. However, program disturbance happens more easily for the resent high-density NAND-type flash memory than before, and there is a problem that there must be a complicated pass voltage pattern for preventing program disturbance.

For example, in the Reference Document 6, the writing voltage is controlled to prevent the program disturbance by the CPU control; however, it is not disclosed nor taught how allocation of the added voltages correspond to each word line.

In addition, for example, in the Reference Document 7, the voltage generation device is disclosed which utilizes the ISPP (Increment Step Pulse Program) method when programming; however, in order to arrange and utilize the logic circuit, there is a problem that the added voltage cannot be flexibly generated to prevent the program disturbance.

Furthermore, in the Reference Document 8, a circuit is included to allocate the writing voltages which utilize the fixed logic and analog circuits; however, such logic and analog circuits become complicated when the type of the added pass voltage increases. There is a problem that the size of the circuits will greatly increase.

The goal of the present invention is to solve the above problems. In a circuit of smaller size compared to the conventional technologies, a non-volatile semiconductor memory device and a writing method thereof are provided to be capable of writing and flexibly setting the program voltage and the pass voltage to prevent program disturbance when the word line voltage is set. In addition, in the following descriptions, the program disturbance is a collective term of the above three types of disturbances, and the program voltage is a collective term of the program voltage and the pass voltage.

The Methods for Solving the Problems

The first invention relates to a non-volatile semiconductor memory device which is utilized to implement writing of data by adding a predetermined voltage thereto for assigning a word line to a non-volatile memory cell. The non-volatile semiconductor memory device includes a control processor, a writing controller, a voltage generation circuit, and a switch circuit. The control processor is utilized to generate and output control data and implement a program code for the writing of the data which includes a word line assignment command and voltage source assignment data. The writing controller is utilized to decode the control data and generate a control signal of the word line assignment command and a control signal of the voltage source assignment data. The voltage generation circuit is utilized to generate a plurality of voltages for the writing of the data. The switch circuit is utilized to select a voltage, corresponding to the voltage source assignment data, among the plurality of voltages, according to the control signal of the word line assignment command and the control signal of the voltage source assignment data, and utilized to output the selected voltage to the word line corresponding to the word line assignment command.

In the above non-volatile semiconductor memory device, the program code, the control processor, the writing controller, the voltage generation circuit and the switch circuit are expanded for application to the operation of reading or erasing in addition to writing.

Furthermore, in the above non-volatile semiconductor memory device, the switch circuit comprises a plurality of registers which correspond to a plurality of word lines, respectively, temporarily memorizing the voltage source assignment data corresponding to the control signal of the word line assignment command, and the switch circuit comprises a plurality of switches which correspond to the plurality of registers, respectively, operating according to the control signal from the corresponding register among a plurality of voltages from the voltage generation circuit, and selecting and outputting a voltage corresponding to the voltage source assignment data.

Furthermore, in the above non-volatile semiconductor memory device, the non-volatile semiconductor memory device further comprises a ROM to store the program code and output it to the control processor.

Furthermore, in the above non-volatile semiconductor memory device, the program code is stored by an area determined by the memory cell and is read by the control processor.

Furthermore, in the above non-volatile semiconductor memory device, the program code is from an external device to maintain an operation mode for input to the control processor.

Furthermore, in the above non-volatile semiconductor memory device, the non-volatile semiconductor memory device further comprises an SRAM to store the program code and output it to the control processor.

Furthermore, in the above non-volatile semiconductor memory device, the program code comprises:

(1) an assembly code to command the voltage settings, (2) the word line assignment command to assign one word line or a plurality of word lines which should be selected, (3) the voltage source assignment data to assign the voltage source which should be added to the word line which should be selected.

Furthermore, in the above non-volatile semiconductor memory device, the word line assignment command is featured by assigning a word line by an absolute address or a relative address corresponding to the selected word line.

Furthermore, in the above non-volatile semiconductor memory device, the voltage source assignment data is featured by assigning a voltage of the voltage source which should be added by an actual voltage or a relative voltage from the voltage which is previously set.

The second invention relates to a writing method for a non-volatile semiconductor memory device which is utilized to implement writing of data by adding a predetermined voltage thereto for assigning a word line to a non-volatile memory cell. The writing method includes generating and outputting control data which implements a program code for the writing of the data which includes a word line assignment command and voltage source assignment data by a control processor, decoding the control data and generating a control signal of the word line assignment command and a control signal of the voltage source assignment data by a writing controller, generating a plurality of voltages for the writing of the data by a voltage generation circuit, and selecting a voltage, corresponding to the voltage source assignment data, among the plurality of voltages, according to the control signal of the word line assignment command and the control signal of the voltage source assignment data, and outputting the selected voltage to the word line corresponding to the word line assignment command by a switch circuit.

The Effects of the Present Invention

The present invention relates to a non-volatile semiconductor memory device and a writing method thereof to implement the writing of the data embedded in the CPU 20 and the writing controller, to provide a smaller circuit size compared with the conventional technology, and to provide a writing method capable of flexibly setting the program voltage for preventing program disturbance. In addition, the conventional way for revising the program voltage type is necessary the mask revising and wafer process. However, for example, since the sequence or the voltage types of the program voltage may be changed by inputting the program code (software) from the memory tester, not only will costs but also development time may be greatly reduced.

BRIEF DESCRIPTION OF THE DRAWINGS

For a more complete understanding of the illustrative embodiments and the advantages thereof, reference is now made to the following descriptions in conjunction with the accompanying drawings.

FIG. 9 is a table illustrating a word line assignment command and its code and meaning which is utilized when setting the word line voltage of the NAND-type flash EEPROM of FIG. 3.

FIG. 17 is a diagram illustrating the setting example of allocating the word line voltage of the capable setting combinations for the word line assignment command when setting the word line voltage of the NAND-type flash EEPROM of FIG. 3.

FIG. 18 is a diagram illustrating a different example of allocating the word line voltages of FIG. 17.

FIG. 19 is a diagram illustrating the setting example of allocating the word line voltages when changing the selected word line in the NAND-type flash EEPROM of FIG. 3.

FIG. 20 illustrates the setting example of allocating the word line voltages when reading and erasing are operated in the NAND-type flash EEPROM of FIG. 3.

FIG. 21 illustrates the setting example of allocating the word line voltages when reading is operated in the NAND-type flash EEPROM of FIG. 3.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated mode of carrying out the invention. In each of the following descriptions, the same composition element is marked by the same symbol. This description is made for the purpose of illustrating the general principles of the invention and should not be received in a limiting sense. The scope of the invention is best determined by reference to the appended claims.

Figure 1:
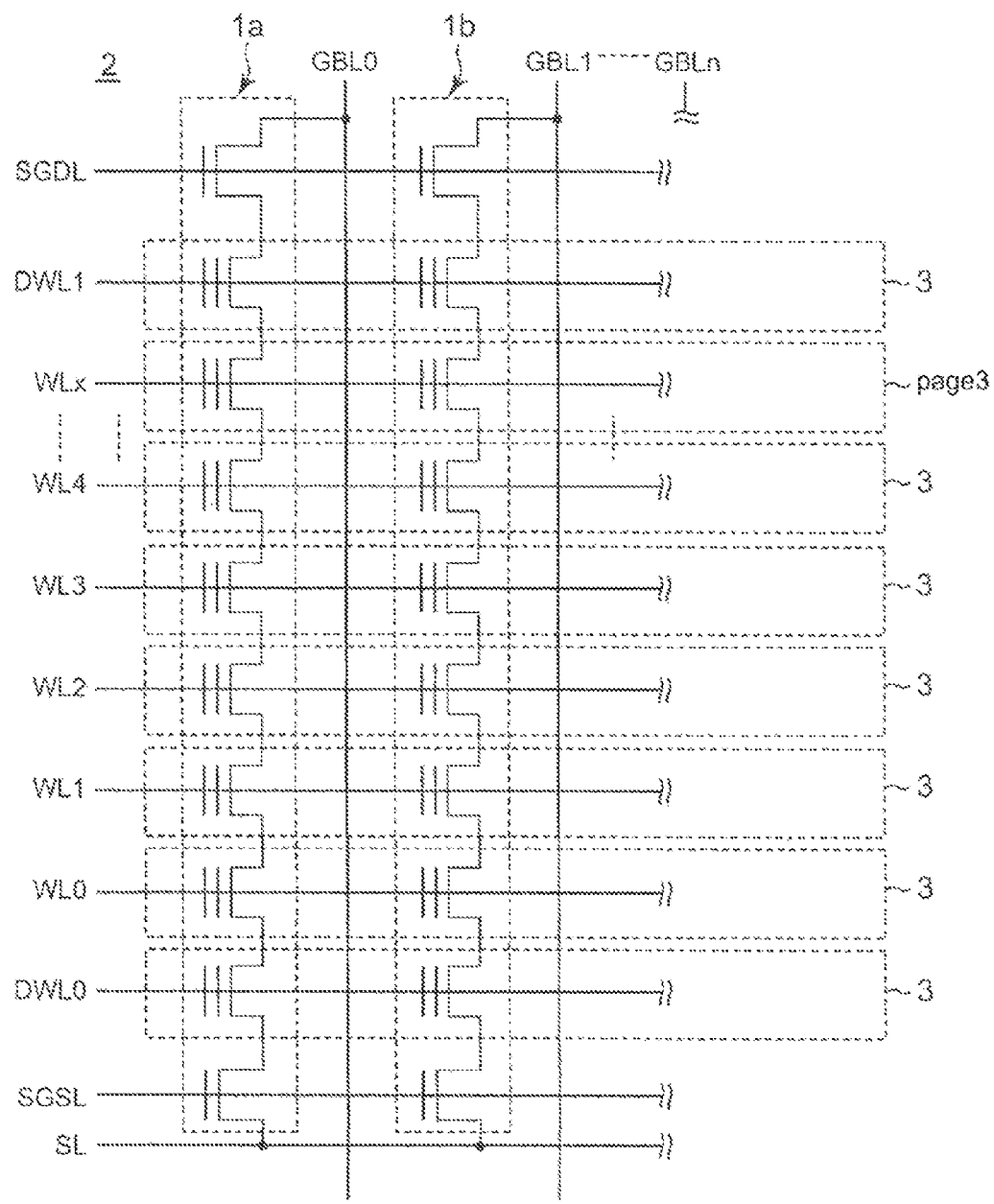
FIG. 1 is a rough circuit diagram illustrating the arrangement of the memory cell array 2 of the NAND-type flash EEPROM relating to an embodiment of the present invention.

FIG. 1 is a rough circuit diagram illustrating the arrangement of the memory cell array 2 of the NAND-type flash EEPROM relating to an embodiment of the present invention. In addition, FIG. 2 is a rough block diagram illustrating the arrangement of the memory cell array 2 of FIG. 1 and its surrounding circuits.

Referring to FIG. 1, the NAND flash memory array 2 includes a plurality of word lines WL0~WLx, two dummy word lines DWL0 and DWL1, two selected gate lines SGDL and SGSL, a plurality of global bit lines GBL0~GBLn and the source line SL. The x and n are integers greater than zero, respectively. The word lines WL0~WLx, DWL0 and DWL1 which relate to the active area are connected to the controlled gate electrode of each of the memory cell. Each cell string is composed by directly connecting the memory cells and is arranged under the global bit lines GBL0~GBLn, respectively. The cell string 1a is connected to the global bit line GBL0, and the cell string 1b is connected to the global bit line GBL1. In other words, the intersection points of the global bit lines GBL0~GBLn and the word lines WL0~WLx, DWL0 and DWL1 correspond to each memory cell. In this embodiment, for example, the global bit line GBL0 is the selected bit line while the other bit lines are not selected, and the word line WL2 is the selected word line while the other word lines are not selected. The cell string which is connected to the unselected bit line is named the inhibited cell string.

The two selected gate lines SGDL and SGSL which relate to the active area, respectively, function as the gate of the SGDL transistor which is the drain side select transistor and the gate of the SGSL transistor which is the source side select transistor.

Figure 2:
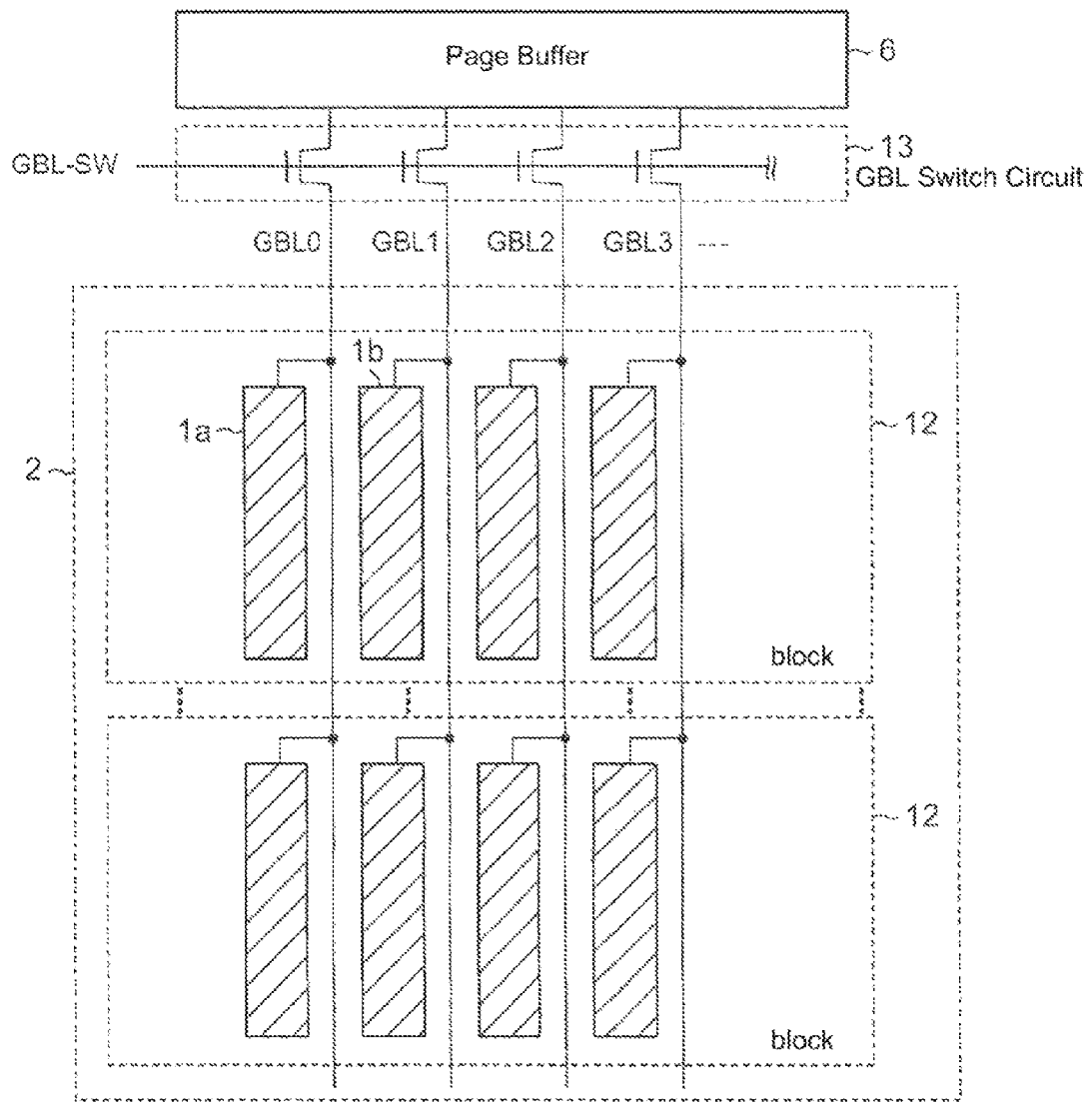
FIG. 2 is a rough block diagram illustrating the arrangement of the memory cell array 2 of FIG. 1 and its surrounding circuits.

Referring to FIG. 2, the NAND memory array 2 is divided into a plurality of blocks 12. Each global bit line GBL0~GBLn is connected to the page buffer 6 through the global bit line (GBL) switch circuit.

Figure 3:
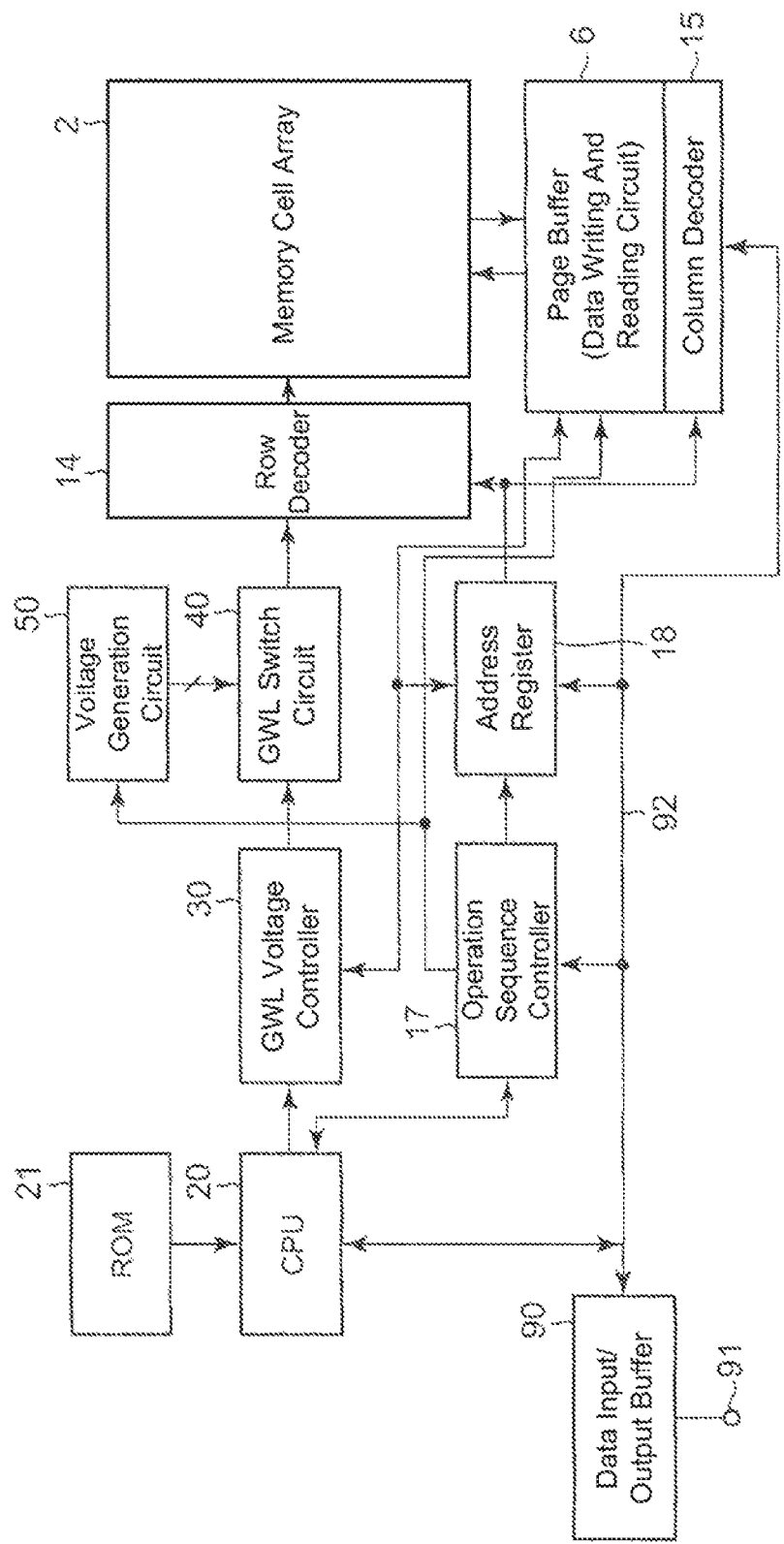
FIG. 3 is a block diagram illustrating the overall composition of the NAND-type flash EEPROM of FIG. 1.

FIG. 3 is a block diagram illustrating the overall composition of the NAND-type flash EEPROM of FIG. 1. Furthermore, FIG. 3 is mainly focused on the circuit for programming (writing) data to the NAND-type flash EEPROM and the reading of the data is roughly illustrated. In FIG. 3, the NAND-type flash EEPROM related to the embodiment includes the memory cell array 2, the row decoder 14, the page buffer (data rewriting and reading circuit) 6, the column decoder 15, the data input/output buffer 90, the input/output terminal 91, the data line 92, and the ROM 21 to memorize the program code for controlling the operations of writing, erasing or reading data, the CPU 20 to output the controlling data for executing the program code, the GWL voltage controller 30 to control the operations of the global word line (GWL) switch circuit 40 and the page buffer 6 according to the assignment signal from the CPU 20, the voltage generation circuit 50 for generating all kinds of voltages, the GWL switch circuit 40 to generate GWL voltages for writing data and so on by utilizing each voltage from the voltage generating circuit 50 which is according to the controlling signal from the GWL voltage controller 30 and for outputting GWL voltages to the row decoder 14, the operation sequence controller 17 to control the page buffer and so on for reading data, and the address register 18 for outputting the selected address to the GWL voltage controller 30 and so on which maintain the selected address.

As shown in FIG. 1, for example, the memory cell array 2 is composed by a NAND cell unit NU, and each NAND cell unit NU has X+1 non-volatile memory cells which are arranged in series and capable of electrically re-writing with stacked gate structures. Each NAND cell unit is connected to the global bit lines GBL0 and GBL1 through the select gate transistor by the drain side, and connected to the common source line SL through the select gate transistor by the source side. The control gates of the memory cells juxtaposed in the row direction are connected to the word line together, and the gate electrode of each select gate transistor is connected to the select gate lines SGDL and SGSL which are arranged in parallel to the word line WL. The range of the memory cell selected by one word line is for reading and writing with the unit of one page. The range of a plurality of NAND cell unit NU of one page or a multiple of the pages is for erasing data with the unit of one block. The page buffer (the re-writing and reading circuit) 6 is composed of the sense amplifier (SA) and the latch (DL) which are always provided corresponding to the bit line for reading and writing data of the unit of one page.

To simplify the structure of the memory cell array 2 of the FIG. 2, a plurality of bit lines may also be commonly used for the page buffer. In the case, when the operations of reading and writing data are executed, the number of the connected bit lines chosen by the page buffer is the unit of one page. FIG. 2 illustrates a range of the block 12 of the cell array which executes data input/output between one input/output terminal. The row decoder 14 and the column decoder 15 are respectively provided to perform the selection of the word line WL and the global bit line GBL of the memory cell array 2. The GWL voltage controller 30 controls the voltages of word lines to control the GWL switch circuit 40 while reading or writing data. The operation sequence controller 17 controls the page buffer 6 and so on according to the instruction from the CPU 20 and performs the control of reading data. The voltage generation circuit 50 generates various necessary voltages for reading or writing data and outputs to the GWL switch circuit 40. The GWL switch circuit 40 generates voltages which are determined by the control signal from the GWL voltage controller 30 and outputs to the row decoder 14.

The data input/output buffer 90 is utilized for the input/output of data and the input of the command and the address signal. In other words, the write data and the read data are transmitted between the input/output terminal 91 and the page buffer 6 through the data input/output buffer 90 and the data line 92. In addition, the address signal inputted from the input/output terminal 91 is maintained by the address register 18, and transmitted and decoded by the row decoder 14 and column decoder 18 and GWL voltage controller 30. In addition, the command for the controlling operation is also inputted from the input/output terminal 91. The inputted command is decoded by the operation sequence controller 17 and controls the reading of the data by controlling the page buffer 6 and the address register 18 and so on. The control signals such as the chip enable signal CEB, the command latch enable signal CLE, the address latch enable signal ALE, the writing enable signal WEB, the reading enable signal REB and so on are inputted to the controller 17 and 30. Furthermore, the internal control signal is generated in correspondence with the operation mode. The internal control signal is utilized for controlling the data latch in the data input/output buffer 90 and the transmission and so on and transmitted to the controller 17 and 30 to control the operation.

The page buffer 6 includes two registers which are capable of switching the functions of the multi-level operation and the cache. In other words, the cache function is provided when the two-level data of one bit is memorized in one memory cell, and the cache function may be enabled by being restricted with the operation timing and the address when the four-level data of the two bits is memorized in one memory cell.

Figure 4:
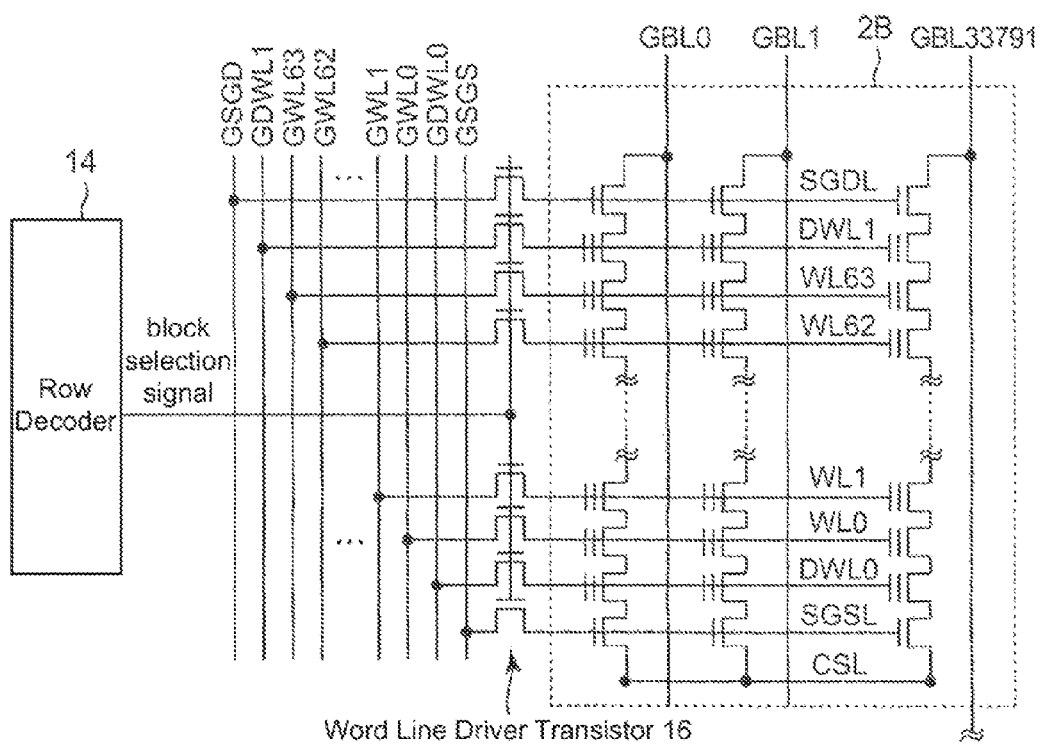
FIG. 4 is a circuit diagram illustrating the relation between the word line and the global word line (GWL) in the NAND-type flash EEPROM of FIG. 3.

FIG. 4 is a circuit diagram illustrating the relation between the word line and the global word line (GWL) in the NAND-type flash EEPROM of FIG. 3. As shown in FIG. 4, 2B is a memory cell block which is selected by the block select signal from the row decoder 14. The voltage of the global word line is added to the word line of the memory cell within the memory cell block 2B through the word line driver transistor 16 which is controlled by the block select signal from the row decoder 14. Therefore, the global word line includes the assembly of word lines corresponding to a plurality of memory cell blocks 2B.

Figure 5:
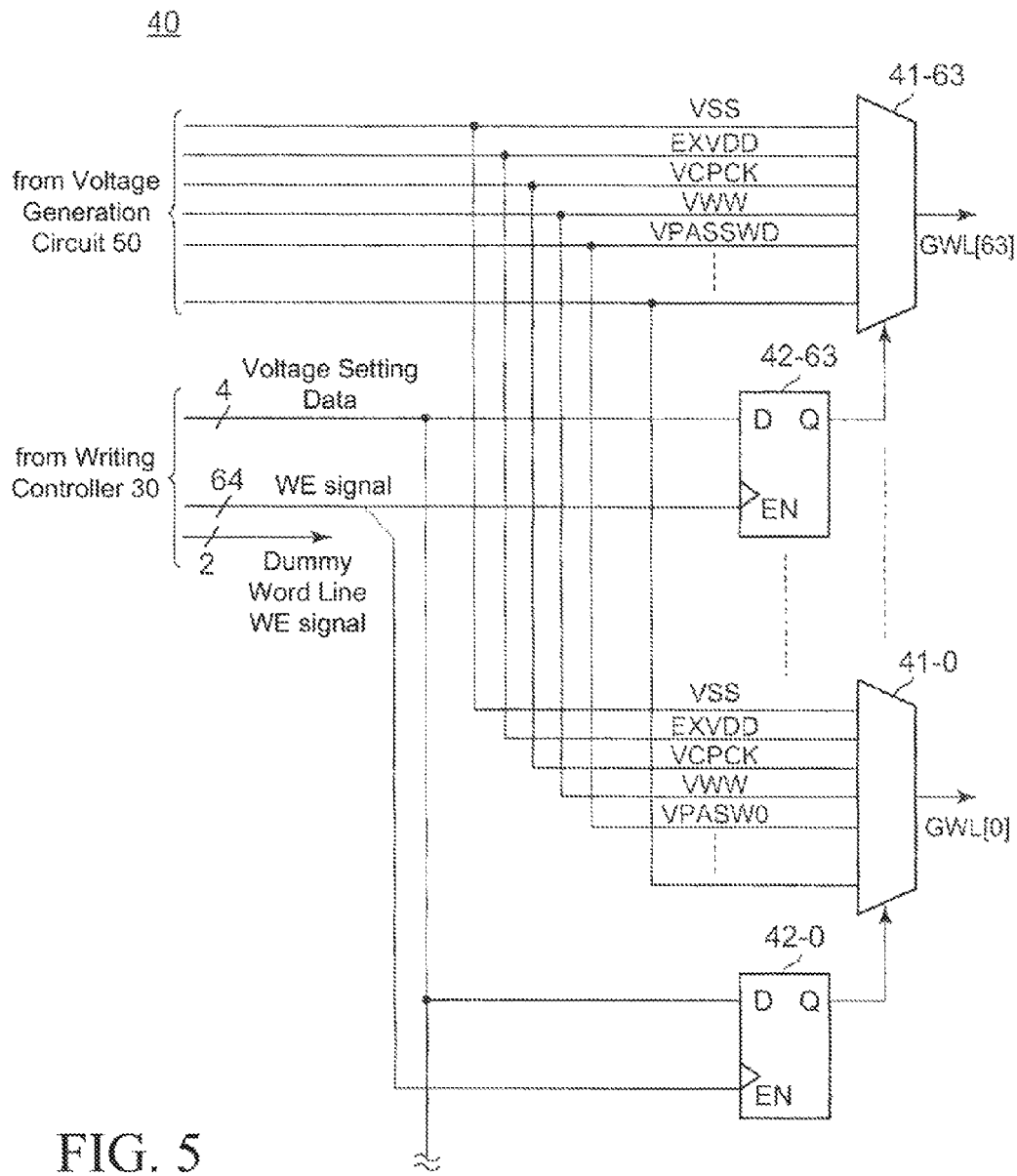
FIG. 5 is the block diagram illustrating the composition of the GWL switch circuit 40 of FIG. 3.

FIG. 5 is the block diagram illustrating the composition of the GWL switch circuit 40 of FIG. 3. In FIG. 5, the GWL switch circuit 40 is composed of sixty-four switches 41-0~41-63 and sixty-four registers 42-0~42-63. The voltage source assignment data from the GWL voltage controller 30 is inputted to each register 42-0~42-63 and stored temporarily in a selected register (one or a plurality between 42-0~42-63) corresponding to the write enable signal (WE signal). Afterwards, the selected voltage which corresponds to the voltage source assignment data is outputted by the switch (one of 41-0~41-63) to the corresponding global word line. In addition, the dummy word lines (two) from the GWL voltage controller 30 is controlled in the same way, and there are few types for setting the voltages of the word lines.

Figure 6:
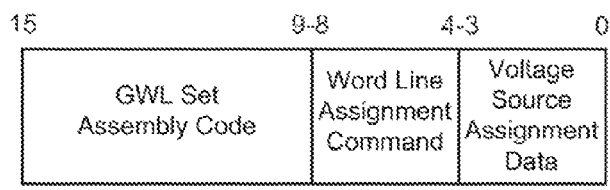
FIG. 6 illustrates the structure of the CPU command (program code) when it is set by the word line voltage of the NAND-type flash EEPROM of FIG. 3.

FIG. 6 illustrates the structure of the CPU command (program code) to set the word line voltage of the NAND-type flash EEPROM of FIG. 3. In FIG. 6, the CPU command (program code) includes the following items. (1) the command code which is the GWL set assembly code (for example, word line voltage set (WLSET)). (2) the word line assignment command (referring FIG. 9), and (3) the voltage source assignment data (referring to FIG. 8).

Figures 7A, 7B, 8:
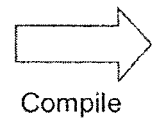
FIG. 7(a) is a diagram illustrating an example of the program code which is utilized when setting the word line voltage of the NAND-type flash EEPROM of FIG. 3.
FIG. 7(b) is a diagram illustrating the object code within the ROM 21 when the program code of FIG. 7(a) is compiled.
FIG. 8 is a table illustrating the relationship between the voltage source assignment data (name) within the program code and the voltage source assignment data within the ROM 21 when the voltage of the word line of the NAND-type flash EEPROM of FIG. 3 is set.

FIG. 7(a) is a diagram illustrating an example of the program code which is utilized when setting the word line voltage of the NAND-type flash EEPROM of FIG. 3. FIG. 7(b) is a diagram illustrating the object code within the ROM 21 when the program code of FIG. 7(a) is compiled. In order to clarify FIG. 6 and FIG. 7, there are seven bits, five bits and four bits (16 bits in total) of code within the ROM 21 after compiling the program code. Within it, the latter nine bits are the assigning code M2BCODE[8:0] which includes the word line assignment command and the voltage source assignment data. The example (1) of FIG. 7(a) illustrates that the voltage source VWW is connected to the selected word line (WLN). The example (2) of FIG. 7(a) illustrates that the voltage source VPASSWADJ is connected to the word line (NMINUSONE) which is (N−1) next to the selected word line. The example (3) of FIG. 7(a) illustrates that the voltage source VPASSWS is connected to the all word lines (SOURCESIDE0) from the word line WL which is nine next to the selected word line to the word line WL0. Furthermore, the word line assignment command and the voltage source assignment data are respectively illustrated in the lists of FIG. 9 and FIG. 8.

FIG. 8 is a table illustrating the relationship between the voltage source assignment data (name) within the program code and the voltage source assignment data within the ROM 21 when the voltage of the word line of the NAND-type flash EEPROM of FIG. 3 is set. In other words, FIG. 8 illustrates the type of the voltage source and its corresponding voltage source assignment data (assembler code name) and the voltage source assignment data (object code). A main purpose of the voltage source (one example) is illustrated as follows.

VCPCK: General 7V
VWW: Writing voltage
VREAD: Reading voltage
VPASSR: Pass voltage of the un-selected word line while reading
VPASSWxx: Pass voltage of the un-selected word line while writing
VPASSWDT/SB: voltage setting of the dummy word line Therefore, in this embodiment, the voltage sources may be completely utilized during the programming operation. Since the reading operation or the erasing operation is generally not necessary such many types, restricting the usage is available. Furthermore, for example, regarding "VREAD", 1.5V is provided and supplied to the selected word lines when reading is operated. For example, 0.5V is provided when programming or erasing is operated, and different voltage value can be provided for different operation modes. Similarly, for example, "VPASSR" assigns the pass voltage of 5~6V which is provided to the un-selected word line when reading is operated, and 3V is utilized when programming is operated.

FIG. 9 is a table illustrating a word line assignment command and its code and meaning which is utilized when setting the word line voltage of the NAND-type flash EEPROM of FIG. 3. In other words, FIG. 9 roughly illustrates the command code executing the word line assignment with a list.

In FIG. 9, for example, "NMINUSTWO" assigns the word line which is two next (lower side) to the selected word line (N−2). "SOUCESIDE0" assigns a plurality of word lines from the word line which is nine next (lower side) to the selected word line to the word line WL2. Note that such commands may be arbitrarily changed with design. In this embodiment, the overlap command is not utilized, but it may be changed as, for example, "SOUCESIDE0" assigns all word lines next to the selected word line, and it may be reset by utilizing another "NMINUSONE" or "NMINUSTWO" if necessary. As clearly illustrated by FIG. 9, one word line or a plurality of word lines may be assigned by the word line command.

Figure 10:
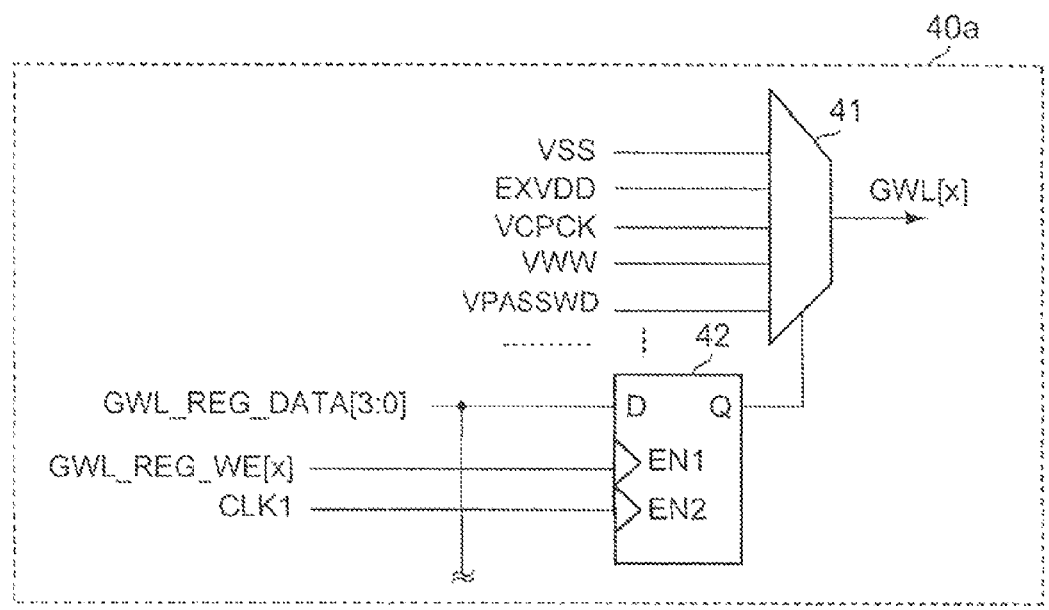
FIG. 10 is a block diagram illustrating a detailed composition of the unit circuit 40a of the GWL switch circuit 40 of FIG. 3.

FIG. 10 is a block diagram illustrating a detailed composition of the unit circuit 40a of the GWL switch circuit 40 of FIG. 3. In other words, FIG. 10 illustrates the unit circuit 40a of one word line of the GWL switch circuit 40. When there are sixty-four memory cells of NAND strings, sixty-four unit circuits 40a are arranged in parallel. Furthermore, two unit circuits 40a are arranged in parallel by reducing the number of the few voltage sources in order to utilize the dummy word line. The fourbits of voltage source assignment data GWL_REG_DATA for assigning the voltage source and the selection signal GWL_REG_WE (write enable signal) of the register 42 are inputted to the register 42 of fourbits, and the data received by the register 42 at the trigger of the clock CLK1. The voltage of the voltage source which is selected by the switch 41 and assigned by the voltage source assignment data outputted from the register 42 is outputted to the global word line GWL[x].

Figure 11:
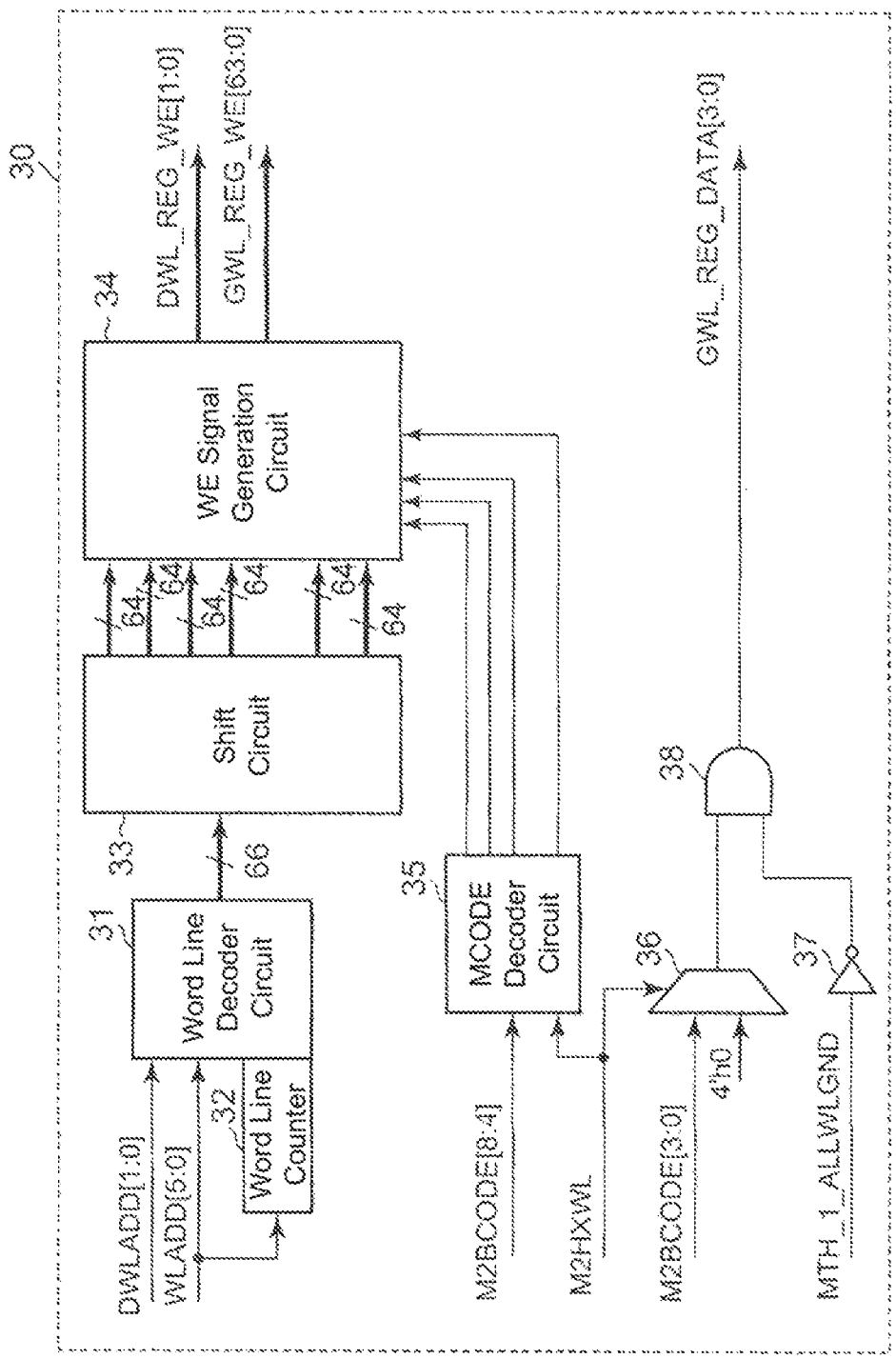
FIG. 11 is a block diagram illustrating the composition of the GWL voltage controller 30 of FIG. 3.

FIG. 11 is a block diagram illustrating the composition of the GWL voltage controller 30 of FIG. 3. In FIG. 11, the GWL voltage controller 30 includes the word line decoder circuit 31, the word line counter 32, the shift circuit 33, the write enable signal (WE signal) generation circuit 34, the MCODE decoder circuit 35, the switch 36, the inverter 37 and the AND gate 38. The GWL voltage controller 30 generates the voltage assignment data signal GWL_REG_DATA[3:0] and the write enable signal GWL_REG_WE[63:0] for the selection signal of the register 42 from the input data of the word line address WLADD[5:0] and the assignment data M2BCODE[8:0] with the object code from the ROM 21.

The word line decoder 31 decodes the word line address WLADD[5:0] and the dummy word line address DWLADD[1:0] and outputs sixty-six address signals to the shift circuit 33. One address signal from the sixty-six address signals becomes the write enable signal for the selected word line. The shift circuit 33 outputs the signal which is equivalent to the NMINUSONE, the NMINUSTWO or the SOURCESIDE 0 of FIG. 9 from the write enable signal of the selected word line in the sixty-six address signals. There are sixty-four write enable signals GWL_REG_WE[63:0]. In the write enable signals GWL_REG_WE[63:0], the bit or bits of the position of the word line which corresponds to the meaning of the signal of FIG. 9 becomes "1". The MCODE decoder 35 decodes the word line assignment command of the fourth to eighth bit of the assignment code M2BCODE with the object code from the ROM 21 and outputs it to the WE signal generation circuit 34 for identifying the signal from the received command. The WE signal generation circuit 34 generates the write enable signal GWL_REG_WE from the signals from the shift circuit 33 and the MCODE decoder circuit 35. On one hand, the voltage source assignment data of the zero to the third bit of the assignment code M2BCODE is passed through the logic circuits including the switch 36 and the AND gate 38 and outputted as the voltage source assignment signal GWL_REG_DATA. Therefore, the assignment code M2BCODE is selected and outputted by the switch 36 when the signal M2HXWL is at a high level; otherwise the four bits data is "0000" and is outputted from the switch 36. This is utilized for resetting and assigning the voltage source as the ground level (GND).

Figure 12:
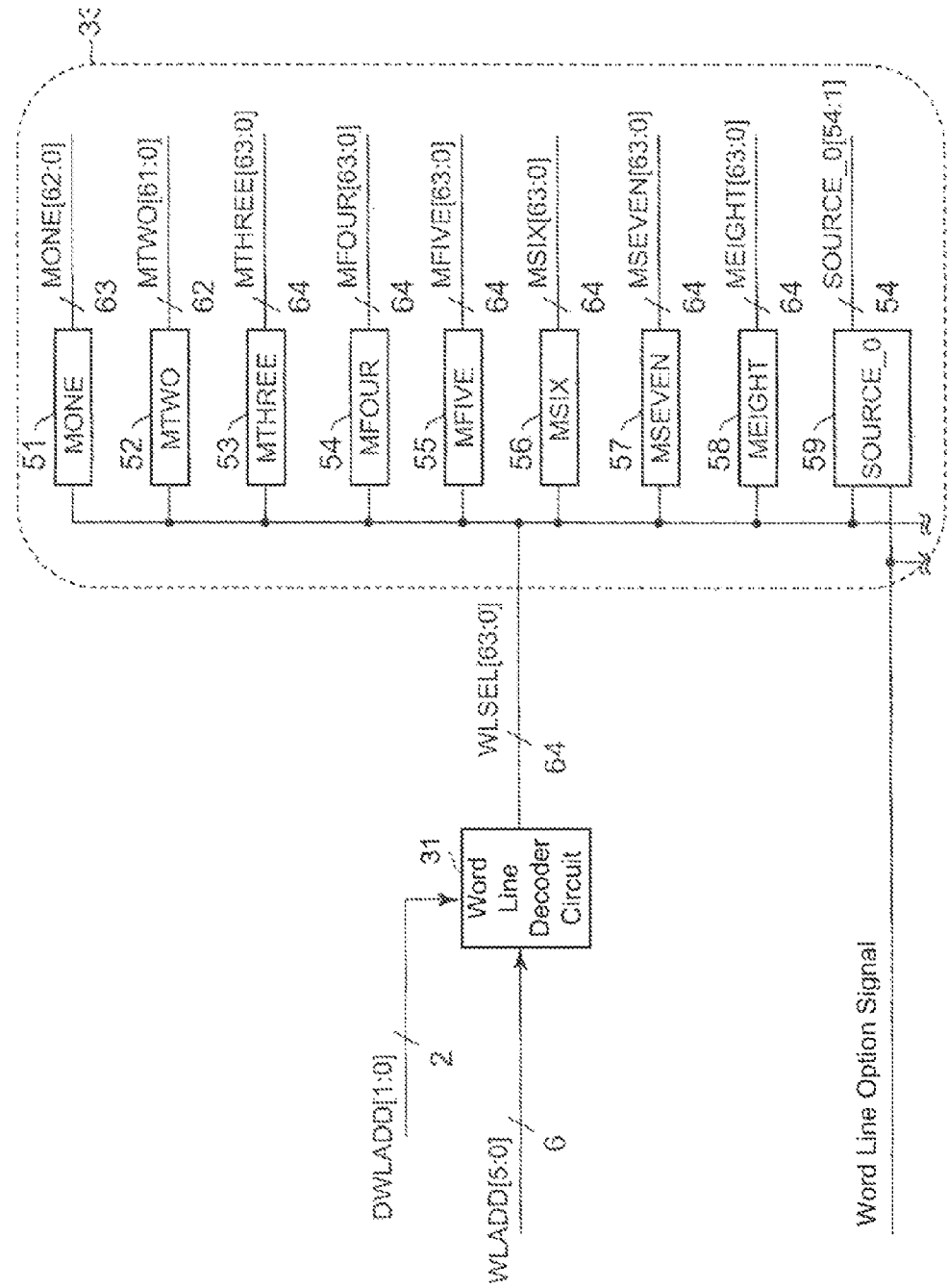
FIG. 12 is a block diagram illustrating the compositions of the shift circuit 33 and the word line decoder circuit 31 of FIG. 11.

FIG. 12 is a block diagram illustrating the compositions of the shift register 33 and the word line decoder circuit 35. FIG. 12 especially illustrates a portion of the composition of the shift circuit 33. In FIG. 12, the shift circuit 33 is composed of the logic circuits 51~59 which include data shift circuits and generate all kinds of signals for generating write enable signals according to the selected word line data WLSEL from the word line decoder circuit 35. For example, the MONE signal is equivalent to the above NMINUSONE signal of the meaning of (N−1), and "1" is set on the bit of the word line next to the selected word line. The (N−1) or (N−2) or (N+1) and so on becomes the foundation for the data shift circuit. The bit column is shifted by one bit, therefore, the bit of the position of the word line which is one next to the selected word line becomes "1". Furthermore, the bit column is shifted by two bits and the bit of the position of the word line which is two next to the selected word line becomes "1". Other signals are generated by the logic circuits 51~59 with other signals or the relation of the selected word line and the number of the word line. Furthermore, the word line option signal is utilized to assign the word line according to a signal other than the address signal.

Figure 13:
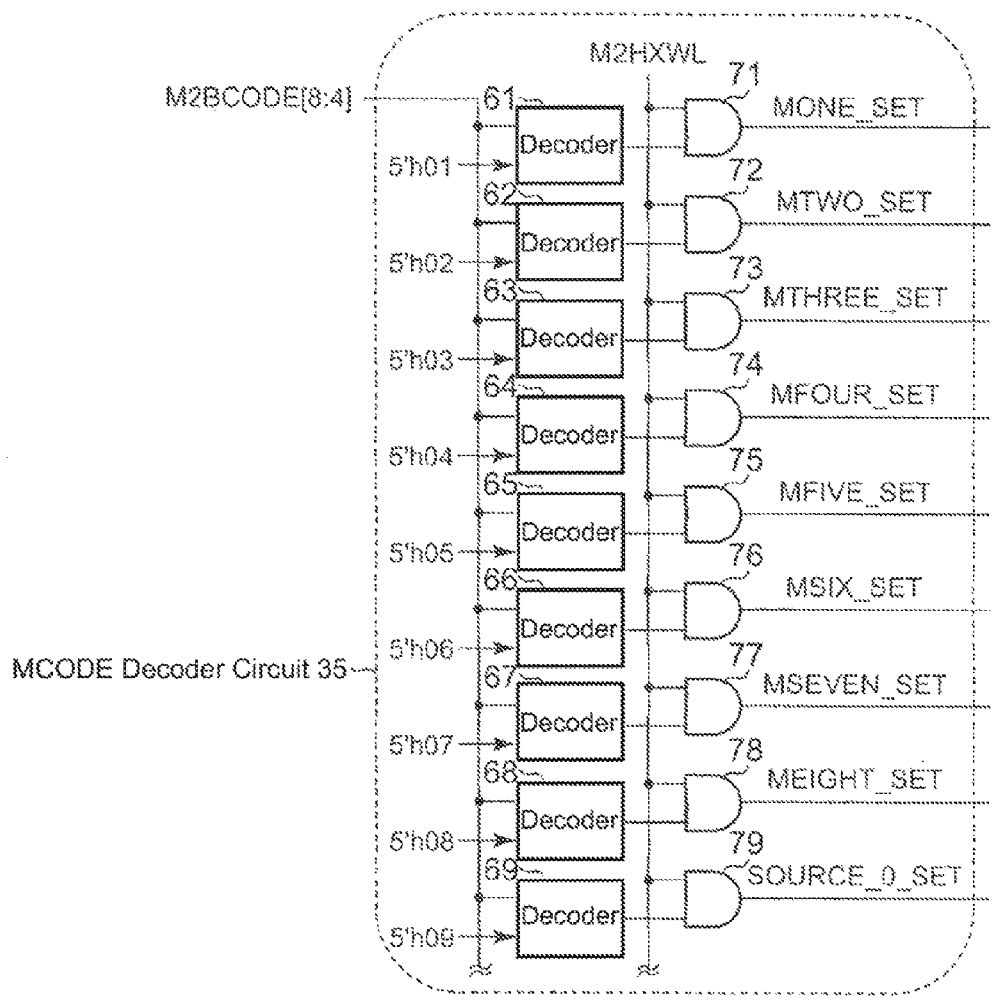
FIG. 13 is a block diagram illustrating the composition of the MCODE decoder circuit 35 of FIG. 11.

FIG. 13 is a block diagram illustrating the composition of the MCODE decoder circuit 35 of FIG. 11. FIG. 13 especially illustrates a portion of the MCODE decoder circuit 35. In FIG. 13, the MCODE decoder 35 is composed of the decoders 61~69 and the AND gates 71~79 and so on. In this embodiment, the input signals such as 5$h$'01, 5$h$'02 and 5$h$'03 are the codes illustrating the word line assignment command (referring to FIG. 9) of FIG. 6. For example, the 5*h*'03 corresponds to the command NMINUSTHREE of FIG. 9. Accordingly, the name of the output signal MTHREE_SET is provided which corresponds to the command. The assigned code M2BCODE is read from ROM 21, passed through the CPU 20 and inputted to the MCODE decoder circuit 35. If the inputted assignment code M2BCODE is the same as the 5*h*'03 mentioned above, for example, the output signal MTHREE_SET becomes "1". The followings are the same.

Figures 14, 15:
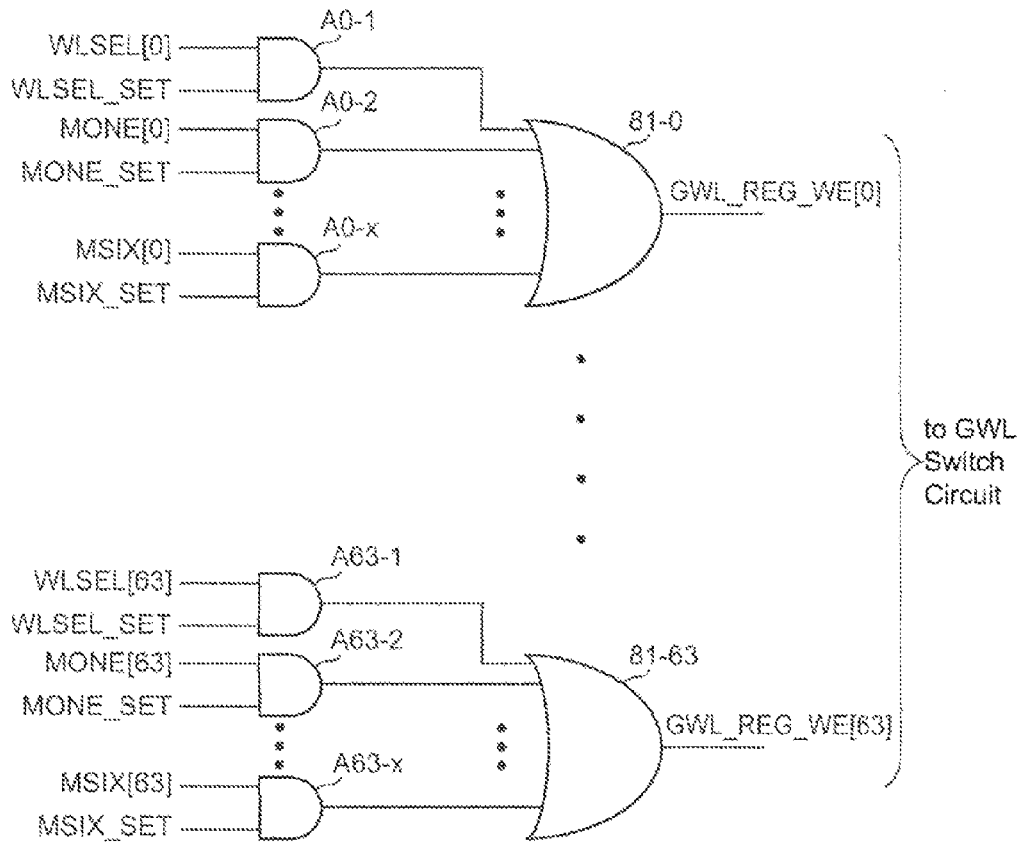
FIG. 14 is a block diagram illustrating the composition of the WE signal generation circuit 34 of FIG. 11.
FIG. 15 is a diagram illustrating an example of the command for setting the word line voltages of the NAND-type flash EPROM of FIG. 3.

FIG. 14 is a block diagram illustrating the composition of the WE signal generation circuit 34. In FIG. 14, it is composed of two-input AND gates A0-1~A63-*x* and OR gates 81-0~81-63. Among the two input terminals of the two-input AND gates A0-1~A63-*x*, one input terminal is inputted by one of the signals which is decoded the word line assignment command from the MCODE decoder circuit 35, and another input terminal is inputted by one of the sixty-four signals corresponding to the word line assignment command from the shift circuit 33. Accordingly, the two-input AND gates A0-1~A63-*x* are basically only the number of the word line assignment command of FIG. 9. Furthermore, the logic circuits may be added for option or test mode.

Afterwards, each OR gate 81-0~81-63 gathers various inputted signals and outputs them to the GWL switch circuit 40. In other words, if the two signals inputted to each AND gate A0-1~A63-X are both "1", the output signals GWL_REG_WE of the latter OR gates 81-0~81-63 become "1" which means that selection signal is on for the register GWL_REG of the global word line GWL to receive GWL_REG_DATA. For example, in the selected word line WL30, if the word line assignment command within the assignment code M2BCODE which is the implementation program code is NPLUSTWO, the bit of the GWL32 among the sixty-four signals within the output signal PTWO is "1" which corresponds to the word line command NPLUSTWO from the shift circuit 33, and the PTWO_SET signal is "1" which corresponds to the word line assignment command NPLUSTWO from the MCODE decoder 35. Accordingly, the two input signals of the 2-input AND gate A0 of the circuit for GWL32 of the WE signal generation circuit 34, PTWO[32] and PTWO_SET, become "1". Therefore, the output signal GWL_REG_WE[32] of the OR gate 81 is "1", accordingly. In this embodiment, a number of write enable signals GWL_REG_WE are "1" in the case of SOURCESIDE0 and so on in FIG. 9. Furthermore, the same circuit is arranged for the dummy word line.

Figure 16:
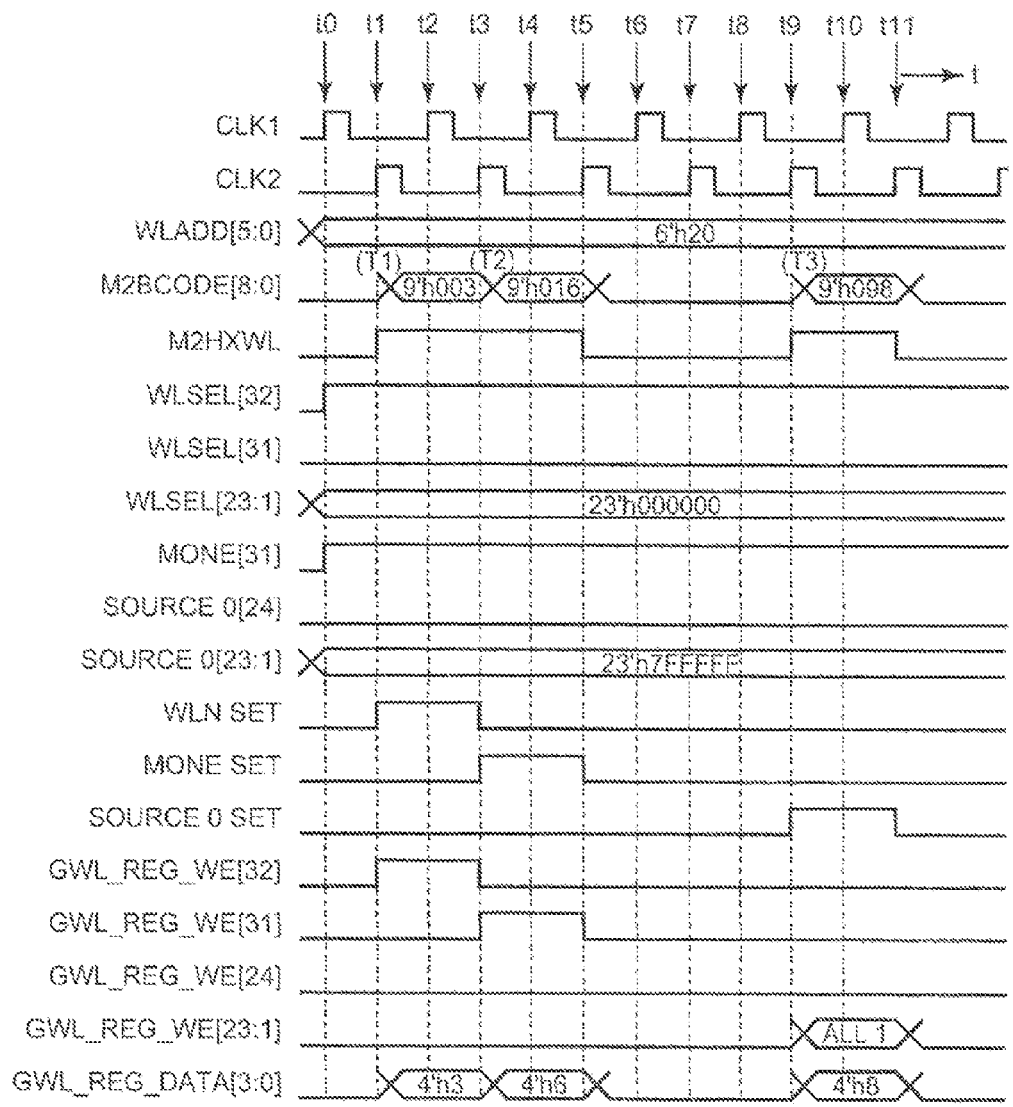
FIG. 16 is the timing chart for executing the command of FIG. 15.

Regarding the operation of the hardware circuits arranged as above, FIG. 15 and FIG. 16 are referred for illustration. FIG. 15 is a diagram illustrating an example of the command for setting the word line voltages of the NAND-type flash EPROM of FIG. 3 and FIG. 16 is the timing chart for executing the command of FIG. 15. In this embodiment, the time t1 to t3 of FIG. 16 corresponds to the operation of the program code T1 of FIG. 15, the time t3 to t5 of FIG. 16 corresponds to the operation of the program code T2, and the time t9 to t11 of FIG. 16 corresponds to the operation of the program code T3.

In the time t0 of FIG. 16, the GWL32 is selected and decoded, the shift circuit 33 is operated, and the WLSEL signal (equivalent to WLN), the MONE signal or the SOURCE0 signal is determined and outputted. Since the GWL32 is selected, the WLSEL[32] is at a high level, and the other WLSEL[x] signals are at a low level, and the MONE [31] signal is at a high level. Regarding the SOURCE0 signal, the SOURCE0[23:1] signal becomes a high level which is equivalent to the global word lines GWL23~GWL1 after the N−9=23.

Afterwards, in the time t1, the assignment code M2BCODE[8:0] which is from the ROM 21 is inputted, the word line assignment command WLN (5*h*'00) is decoded according to the high level of the M2HXWL signal, and the WLN_SET signal becomes a high level. Furthermore, the voltage source assignment data VWW(4*h*'3) is outputted as the output data GWL_REG_DATA. The WLN_SET signal is during the output signal which is from the shift circuit 33 as illustrated before. In the WE signal generation circuit 34, the output signals of the AND gate A0 and the OR gate 81 becomes a high level according to the WLN_SET signal, the WLSEL signal which becomes a pair in the 2-input AND gate A0 and the high-level WLSEL[32] signal. Finally, the GWL_REG_WE[32] only becomes a high level.

In the next time t2, the voltage source assignment data GWL_REG_DATA received in the register 42 of FIG. 10. Furthermore, since the selected word line does not change, the word line WL32 is still selected. Afterwards, regarding other circuits, the next assignment code M2BCODE is prepared and transmitted to the MCODE decoder circuit 35.

Afterwards, in the time t3, the next assignment code M2BCODE is inputted. The 5*h*'01 of the word line command NMINUSONE and the 4*h*'6 of the voltage source assignment data VPASSWADJ are decomposed. Regarding the word line assignment command NMIUSONE, the MONE_SET signal is at a high level as illustrated before according to the MCODE decoder circuit 35. The output signal GWL_REG_WE[31] from the WE signal generation circuit 34 becomes a high level according to the logic calculation by the AND gate A0 of the MONE[31] signal which is at a high level by the shift circuit 33.

Furthermore, in the time t4, regarding the 4*h*'6 of the voltage source assignment VPASSWADJ, since the GWL_REG_WE[31] signal is at a high level, it is received by the register 42 of FIG. 10. Because the next command in the time t5~t8 is NOP (No Operation), the status after the time t4 is remained.

Afterwards, in the time t9 the next assignment command M2BCODE is received. The output signals GWL_REG_WE [23]~[1] become a high level, respectively, as the previous result. In the time t10, the data 4*h*'8 is received by the registers 42-23~42-1 of FIG. 5.

FIG. 17 is a diagram illustrating the setting example of allocating the word line voltage of the capable setting combinations for the word line assignment command when setting the word line voltage of the NAND-type flash EEPROM of FIG. 3. To clearly illustrate FIG. 17, the examples which are set for most of the capable combinations for setting the word line command of FIG. 9 are illustrated, and the word line assignment commands illustrated in FIG. 9 are almost set.

FIG. 18 is a diagram illustrating a different example of allocating the word line voltages of FIG. 17. Afterwards, FIG. 18 illustrates three modes corresponding to different voltage sources. Regarding the selected word line 32 in the case of N=32, for example, the word line WL (N−3) (corresponding to the NMINUSTHREE, WL29) is programmed so that the voltage source VREAD is connected for the mode 0 and the mode 1 and the voltage source VPASSR is connected for the mode 2. In addition, the word line WL (N−6) (corresponding to the NMINUSSIX, WL26) is connected to the voltage source VPASSWS in the mode 0, connected to the voltage source VPASSR in the mode 1, and connected to the voltage source VREAD in the mode 2.

FIG. 19 is a diagram illustrating the setting example of allocating the word line voltages when changing the selected word line in the NAND-type flash EEPROM of FIG. 3. FIG. 19 illustrates an example for sequentially changing the selected word line from WL60 to WL59 to WL58. In this embodiment, if necessary, the command code WL63 or WL62 of the word line assignment command is utilized, instead of the word line assignment command DRAINSIDE0 to assign other voltage sources.

The example of the programming (writing) operation is explained in the above embodiments. The examples of the allocation of the operations for reading and erasing will be illustrated as follows.

FIG. 20 illustrates the setting example of allocating the word line voltages when reading and erasing are operated in the NAND-type flash EEPROM of FIG. 3. In addition, FIG. 21 illustrates the setting example of allocating the word line voltages when reading is operated in the NAND-type flash EEPROM of FIG. 3. FIG. 20 illustrates the cases wherein the capable allocations are probably utilized. As an example of reading, FIG. 21 illustrates a layout example of the word line assignment command VPASSWADJ for the word lines of the two sides of the selected word line.

By the NAND-type flash EEPROM of the embodiment which is composed as above, due to the implementation of the writing of the data which is embedded inside the CPU 20 and the GWL voltage controller 30, the writing method is capable of flexibly setting the program voltage in order to prevent the program disturbance in a smaller circuit size compared with the conventional technology.

Variation Embodiments

Figure 22:
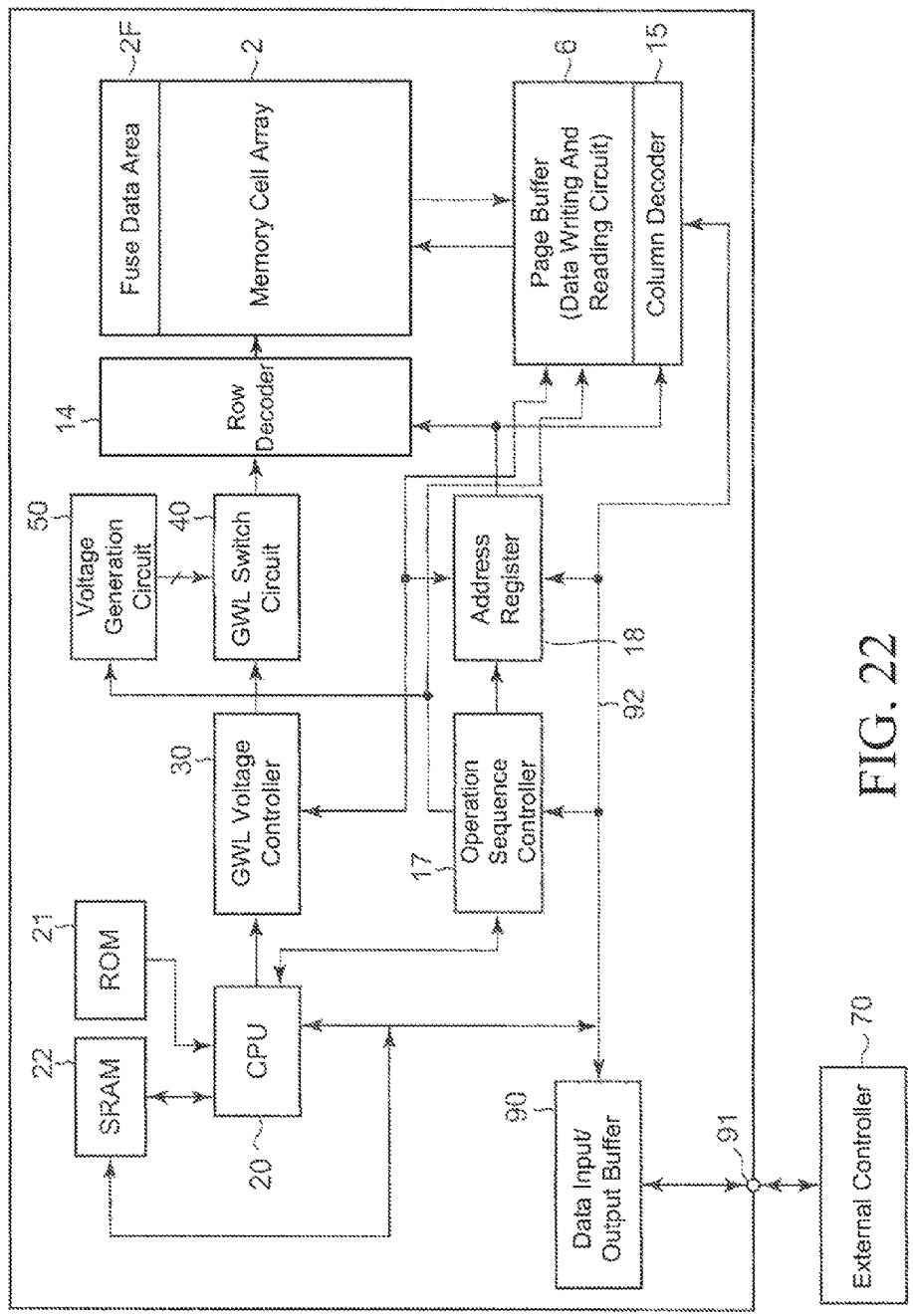
FIG. 22 is a block diagram illustrating a variation embodiment relating the overall composition of the NAND-type flash EEPROM.

FIG. 22 is a block diagram illustrating a variation embodiment relating the overall composition of the NAND-type flash EEPROM. In the embodiment of FIG. 1, the program code for writing which is embedded within the internal ROM 21 is illustrated as an example. The present invention is not limited thereto. As shown in FIG. 22, the program code for writing comes from the external controller 70, and it is loaded into the CPU 20 (including the function of the GWL voltage controller 30) within the NAND-type flash EEPROM through the input/output terminal 91 and the data input/output buffer 90. The implementation prototype maybe executed in the same way by the CPU 20.

In addition, the SRAM (Static Random Access Memory) 22 is provided within the NAND-type flash EEPROM chip. If the operation mode is equipped wherein the program code is loaded to the SRAM 22 and the CPU 20 is executed with the SRAM 22, it is capable of operating the all implementation prototypes by the ROM 21. Furthermore, the data of the ROM 21 is stored in a partial area within the memory cell array 2 (for example, the fuse data area of FIG. 22); therefore, the program code may be easily changed. In this case, the data is automatically read to the SRAM 22 when power of the chip is inputted. Afterwards, ordinary operation is controlled in the same way.

By such methods, the voltage layout toward the word line which is from the external devices of the external controller 70 and so on may be easily changed, and the development time and the cost of the development stage may be greatly decreased. For example, the setting must be changed through the changing of the hardware (circuit). For the conventional way, so that the evaluation for the new setting becomes possible after the circuit changing, the mask preparation and the wafer process. But, in the variation embodiment, it's ok that only the program code from the outside is loaded and executed.

For example, in the case that the out-predetermined voltage must be added to the word line 29 when writing the memory cell of the word line WL 32, the ROM 21 revising and some mask revising or all metal mask revising in the worst case may be required. Furthermore, it is unknown whether it is solved or not until the evaluation after the wafer process. However, regarding the variation embodiment, it is acceptable that only a portion of the new program code of the word line voltage layout from the memory tester is loaded and evaluated. A difference of several weeks and several hours is extremely huge, and a difference of the mask cost and the program cost are also huge.

The NAND-type flash EEPROM is illustrated in the above embodiments, however, the present invention is not limited thereto and it may be applied to various kinds of non-volatile semiconductor memory devices.

The CPU 20 is composed as in the above embodiments. However, the present invention is not limited thereto, for example, the control processor of the DSP and so on may also be composed.

In the above embodiments, the program code for writing data is stored in the ROM 21. However, the present invention is not limited thereto, for example, it may also be stored in the embedded SRAM, or it may also be stored in the defined area of the fuse area 2F and so on within the memory cell array 2 of the NAND-type flash EEPROM.

The CPU command (program code) of setting the word line voltage of FIG. 6 includes the GWL set assembly code, the word line assignment command and the voltage assignment data. In this embodiment, the word line assignment command may be utilized to illustrate the relative address from the selected global word line (or word line), and it may also be utilized to illustrate the absolute address of the global word line (or word line). In addition, the voltage assignment data may be utilized to illustrate the relative voltage from the voltage which is added before, and it may also be utilized to illustrate the actual voltage which is actually added to the global word line (or word line).

As illustrated above in detail, the present invention relates to a non-volatile semiconductor memory device and a writing method thereof to implement the writing of the data embedded in the CPU 20 and the writing command, to provide a smaller circuit size compared with the conventional technology, and to provide a writing method capable of flexibly setting the program voltage for preventing program disturbance. In addition, conventionally the evaluation for revising maybe performed through the wafer process which changes the mask. However, for example, according to the present invention, since the sequence or the voltage types of the program voltage may be changed by inputting the program code (software) from the memory tester, not only will costs but also development time may be greatly reduced.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A non-volatile semiconductor memory device, utilized to implement writing of data by adding a predetermined voltage thereto for assigning a word line to a non-volatile memory cell array, comprising:
   a control processor, utilized to generate and output control data and implement a program code for the writing of the data which includes a word line assignment command and voltage source assignment data;
   a writing controller, utilized to decode the control data and generate a control signal of the word line assignment command and a control signal of the voltage source assignment data;
   a voltage generation circuit, utilized to generate a plurality of voltages for the writing of the data; and
   a switch circuit, according to the control signal of the word line assignment command and the control signal of the voltage source assignment data, utilized to select a voltage, corresponding to the voltage source assignment data, among the plurality of voltages, and utilized to output the selected voltage to the word line corresponding to the word line assignment command,
   wherein the switch circuit comprises a plurality of registers which, respectively, correspond to a plurality of word lines, temporarily memorizing the voltage source assignment data corresponding to the control signal of the word line assignment command, and the switch circuit comprises a plurality of switches which, respectively, correspond to the plurality of registers, operating according to the control signal from the corresponding register among a plurality of voltages from the voltage generation circuit, and selecting and outputting the voltage corresponding to the voltage source assignment data.

2. The non-volatile semiconductor memory device as claimed in claim 1, wherein the program code, the control processor, the writing controller, the voltage generation circuit and the switch circuit are expanded for application to an operation of reading or erasing in addition to writing.

3. The non-volatile semiconductor memory device as claimed in claim 2, wherein the switch circuit comprises a plurality of registers which, respectively, correspond to a plurality of word lines, temporarily memorizing the voltage source assignment data corresponding to the control signal of the word line assignment command, and the switch circuit comprises a plurality of switches which, respectively, correspond to the plurality of registers, operating according to the control signal from the corresponding register among a plurality of voltages from the voltage generation circuit, and selecting and outputting the voltage corresponding to the voltage source assignment data.

4. The non-volatile semiconductor memory device as claimed in claim 1, wherein the non-volatile semiconductor memory device further comprises a ROM to store the program code and output it to the control processor.

5. The non-volatile semiconductor memory device as claimed in claim 2, wherein the non-volatile semiconductor memory device further comprises a ROM to store the program code and output it to the control processor.

6. The non-volatile semiconductor memory device as claimed in claim 1, wherein the program code is stored in a pre-determined area in the memory cell array and is read by the control processor.

7. The non-volatile semiconductor memory device as claimed in claim 2, wherein the program code is stored in a pre-determined area in the memory cell array and is read by the control processor.

8. The non-volatile semiconductor memory device as claimed in claim 1, wherein the program code is from an external device to maintain an operation mode for input to the control processor.

9. The non-volatile semiconductor memory device as claimed in claim 2, wherein the program code is from an external device to maintain an operation mode for input to the control processor.

10. The non-volatile semiconductor memory device as claimed in claim 6, wherein the non-volatile semiconductor memory device further comprises an SRAM to store the program code and output it to the control processor.

11. The non-volatile semiconductor memory device as claimed in claim 7, wherein the non-volatile semiconductor memory device further comprises an SRAM to store the program code and output it to the control processor.

12. The non-volatile semiconductor memory device as claimed in claim 8, wherein the non-volatile semiconductor memory device further comprises an SRAM to store the program code and output it to the control processor.

13. The non-volatile semiconductor memory device as claimed in claim 9, wherein the non-volatile semiconductor memory device further comprises an SRAM to store the program code and output it to the control processor.

14. The non-volatile semiconductor memory device as claimed in claim 1, wherein the program code comprises an assembly code to command the voltage settings, the word line assignment command to assign one word line or a plurality of word lines which should be selected, and the voltage source assignment data to assign a voltage source which should be added to the word line which should be selected.

15. The non-volatile semiconductor memory device as claimed in claim 2, wherein the program code comprises an assembly code to command the voltage settings, the word line assignment command to assign one word line or a plurality of word lines which should be selected, and the voltage source assignment data to assign a voltage source which should be added to the word line which should be selected.

16. The non-volatile semiconductor memory device as claimed in claim 4, wherein the program code comprises an assembly code to command the voltage settings, the word line assignment command to assign one word line or a plurality of word lines which should be selected, and the voltage source assignment data to assign a voltage source which should be added to the word line which should be selected.

17. The non-volatile semiconductor memory device as claimed in claim 6, wherein the program code comprises an assembly code to command the voltage settings, the word line assignment command to assign one word line or a plurality of word lines which should be selected, and the voltage source assignment data to assign a voltage source which should be added to the word line which should be selected.

18. The non-volatile semiconductor memory device as claimed in claim 12, wherein the word line assignment command is featured by assigning the word line by an absolute address or a relative address corresponding to the selected word line.

19. The non-volatile semiconductor memory device as claimed in claim 12, wherein the voltage source assignment data is featured by assigning a voltage of the voltage source which should be added by an actual voltage or a relative voltage from the voltage which is previously set.

20. A writing method for a non-volatile semiconductor memory device, utilized to implement writing of data by adding a predetermined voltage thereto for assigning a word line to a non-volatile memory cell array, comprising:
   generating and outputting control data and implementing a program code for the writing of the data which includes a word line assignment command and voltage source assignment data by a control processor;
   decoding the control data and generating a control signal of the word line assignment command and a control signal of the voltage source assignment data by a writing controller;
   generating a plurality of voltages for the writing of the data by a voltage generation circuit; and
   selecting a voltage, corresponding to the voltage source assignment data, among the plurality of voltages, according to the control signal of the word line assignment command and the control signal of the voltage source assignment data, and outputting the selected voltage to the word line corresponding to the word line assignment command by a switch circuit,
   wherein the switch circuit comprises a plurality of registers which, respectively, correspond to a plurality of word lines, temporarily memorizing the voltage source assignment data corresponding to the control signal of the word line assignment command, and the switch circuit comprises a plurality of switches which, respectively, correspond to the plurality of registers, operating according to the control signal from the corresponding register among a plurality of voltages from the voltage generation circuit, and selecting and outputting the voltage corresponding to the voltage source assignment data.

* * * * *